(12) United States Patent
Jou et al.

(10) Patent No.: US 8,580,604 B2
(45) Date of Patent: Nov. 12, 2013

(54) METHOD FOR PREPARING OLED BY IMPRINTING PROCESS

(75) Inventors: Jwo-Huei Jou, Hsinchu (TW); Sun-Zen Chen, Hsinchu (TW); Shiang-Hau Peng, Hsinchu (TW); Bo-Shian Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 207 days.

(21) Appl. No.: 12/801,760

(22) Filed: Jun. 24, 2010

(65) Prior Publication Data

US 2011/0183454 A1   Jul. 28, 2011

(30) Foreign Application Priority Data

Jan. 22, 2010   (TW) ................................ 99101776 A

(51) Int. Cl.
*H01L 51/50*   (2006.01)
(52) U.S. Cl.
USPC .................... 438/99; 438/34; 438/57; 438/82; 257/40; 257/431; 257/E21.214; 257/E51.018

(58) Field of Classification Search
USPC .................... 438/34, 57, 82, 99; 257/40, 431, 257/E21.214, E51.018
See application file for complete search history.

(56) References Cited

U.S. PATENT DOCUMENTS

2010/0219401 A1*   9/2010   Bradley et al. .................. 257/40
2011/0101479 A1*   5/2011   Arango et al. ................ 257/431

* cited by examiner

*Primary Examiner* — Thanh V Pham
(74) *Attorney, Agent, or Firm* — Bacon & Thomas, PLLC

(57) ABSTRACT

A method for preparing an OLED by an imprinting process is disclosed, which comprises the following steps: (A) providing a substrate, and a first electrode is formed thereon; (B) coating a mold with a first organic material ink; (C) pressing the mold coated with the first organic material ink on the substrate to transfer the first organic material ink onto the first electrode of the substrate, to obtain a first light-emitting array; (D) baking the substrate having the first light-emitting array formed thereon; and (E) forming a second electrode on the first light-emitting array.

19 Claims, 4 Drawing Sheets

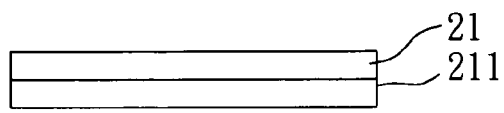
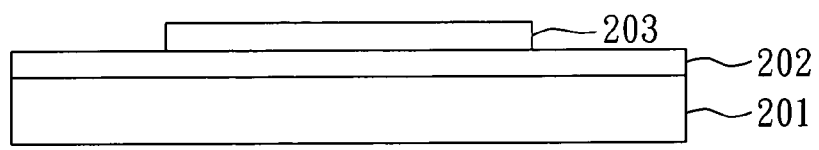
FIG. 2A
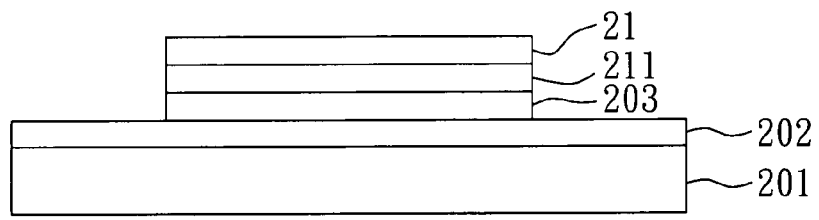
FIG. 2B
FIG. 2C
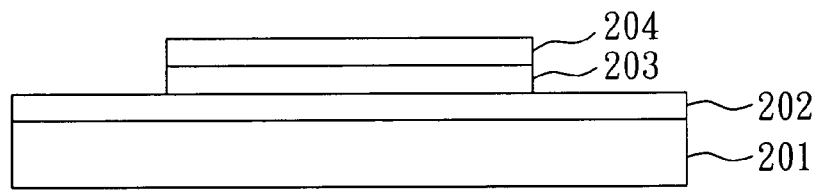
FIG. 2D

METHOD FOR PREPARING OLED BY IMPRINTING PROCESS

BACKGROUND OF THE INVENTION

1. Field of the Invention

The present invention relates to a method for preparing an organic light-emitting diode (OLED) and, more particularly, to a method for preparing an OLED by an imprinting process, in which a large area light-emitting layer can be prepared rapidly.

2. Description of Related Art

Organic light-emitting diodes (OLED) have great potential as a next generation lighting and displaying devices for being ultra-thin (1 mm or less) in thickness, high brightness, wide viewing angle (more than 170°), no backlight requirement, rapid response, high resolution, low heat generation, low energy consumption, and applied as flexible electronics. Hence, the OLED has been widely studied in academic researches and relevant industries. As shown in FIG. 1, the structure of the conventional OLED comprises: a substrate 101, an anode 102, a hole injection/transport layer 103, a light-emitting layer 104, an electron injection/transport layer 105, and a cathode 106. The light-emitting layer 104 is located between the hole injection/transport layer 103 and the electron injection/transport layer 105, and the function of the light-emitting layer 104 is used to generate or control the combination of holes and electrons which resulting in emissions. When the light-emitting layer 104 is composed of all emissionable red, green, and blue organic materials, an OLED with full color can be obtained.

Currently, the light-emitting layer of the OLED can be prepared through a vacuum evaporation process, a spin coating process, or an injection printing process. However, these processes still have some disadvantages described as following.

When the vacuum evaporation process is performed, vacuum equipment has to be used to generate a vacuum condition. However, the vacuum equipment is very expensive, which results in the increase of the production cost. Also, it is difficult to prepare large-area organic layers by using the vacuum evaporation process. Although the large-area organic layers can be formed in a low-cost way through the spin coating process, the spin coating process can only be performed on a substrate with a plane surface. Hence, the spin coating process cannot be used on the substrate with curved surfaces, or the substrate with patterns. In addition, a patterned light-emitting layer cannot be easily obtained through the spin coating process.

In order to reduce the production cost of the OLED, it is desirable to provide a method for preparing a light-emitting layer of an OLED in a rapid and inexpensive way, and further preparing a light-emitting layer with large area and full color.

SUMMARY OF THE INVENTION

The object of the present invention is to provide a method for preparing an OLED by an imprinting process, which can be used to prepare an OLED with large area, full color, and high color rendering.

To achieve the object, the method for preparing the OLED of the present invention comprises the following steps: (A) providing a substrate, and a first electrode formed thereon; (B) coating a mold with a first organic material ink; (C) pressing the mold coated with the first organic material ink onto the substrate, to transfer the first organic material ink onto the first electrode to form a first light-emitting array; (D) baking the substrate with the first light-emitting array formed thereon; and (E) forming a second electrode over the first light-emitting array.

According to the method of the present invention, the baking temperature of the step (D) may be 30-200° C.; and the baking time is not particularly limited, and can be in a range of several seconds to several hours. Preferably, the baking time is in a range of 1 sec to 10 hrs.

According to the method of the present invention, the light-emitting layer of the OLED is prepared through an imprinting process, which has advantages of high manufacturing rate, simple processing, and low production cost. In addition, the mold used in the method of the present invention can be reused, so it is possible to prepare the light-emitting layer by using the same mold to reduce the production cost of the OLED. Also, the imprinting process has the advantage of production in large area, so it is possible to prepare the OLED with large area. Furthermore, the method of the present invention can be applied not only on a substrate with a plane surface, but also on a substrate with a curved surface or a flexible substrate. Hence, the method of the present invention can be used to prepare an organic layer on a substrate with or without patterns.

According to the method of the present invention, a baking process is performed (step (D)) after the light-emitting layer is transferred through an imprinting process. With this step, the performance of the resultant device can be greatly enhanced.

In addition, the method of the present invention may further comprise following steps (C1) and (C2) after the step (C): (C1) coating the mold with a second organic material ink; and (C2) pressing the mold coated with the second organic material ink onto the substrate to form the second light-emitting array. Additionally, after the step (C2) is performed, the steps (C1) and (C2) may be repeated to form plural light-emitting arrays if needed. Herein, the light-emitting arrays (i.e. the first light-emitting array and the following light-emitting arrays) can be formed on the same surface, or laminated on the first electrode sequentially; or parts of the light-emitting arrays are formed on the same surface and the remaining parts of the light-emitting arrays are laminated sequentially.

According to the method of the present invention, the step (E) can be a step (E'): forming a second electrode over the first light-emitting array and the following light-emitting array, when plural light-emitting arrays are formed on the first electrode.

In addition, according to the method of the present invention, the mold may have a designed pattern with protrusions and recesses. When a patterned mold is used in the imprinting process, a light-emitting array with the same pattern as that of the mold, or plural light-emitting arrays with a complex pattern from the combination of the designed pattern can be obtained.

The emitting dyes (or materials) of imprinted light-emitting arrays can be the same materials or preferably chosen from a serial color materials.

For example, a blue light-emitting array can be prepared through a first imprinting process, a green light-emitting array can be transferred through a second imprinting process, and a red for a third imprinting process. Hence, after a series of imprinting processes, organic materials with different emitting colors can be transferred onto the substrate to obtain a light-emitting layer with full color.

Hence, according to the method of the present invention, the first organic material ink and the following organic material ink can independently comprise a green organic material, a red organic material, a blue organic material, or even a mixture of different materials. The example of the green organic material may be BNE, Alq, DPT, Alq$_3$, Bebq$_2$, DMQA, Coumarin 6, Q, NMQ, and Quinacrine. The example of the red organic material may be DCM-2, TMS-SiPc, DCJTB, and ABTX. The example of the blue organic material may be TPAN, DPAN, DPAP, Perylene ($C_{20}H_{12}$), DPVBi, PPD, α-NPD2, β-NPD, TTBND, DCTA, and DAPTz. Other suitable organic materials may also be used in the method of the present invention.

According to the method of the present invention, the first organic material ink and the following organic material inks comprise not only the aforementioned small molecular organic materials, but also polymer organic materials and other imprintable materials. For example, the polymer organic materials can comprise PVK and the aforementioned small molecular organic materials, wherein PVK is used as a host material.

According to the method of the present invention, in the step (A), a hole injection layer, a hole transport layer, or a hole injection/transport layer may be located on the top of first electrode, wherein the hole injection/transport layer has a double-layered structure of a hole injection layer and a hole transport layer. When the imprinting process is performed, the first light-emitting array and/or the following light-emitting arrays (second light-emitting arrays) are formed on the hole injection layer and the hole transport layer.

In addition, the method of the present invention may further comprise a step (D') after the step (D): forming an electron transport layer on the first light-emitting array and/or the following light-emitting arrays (second light-emitting array).

According to the method of the present invention, the mold may be coated with the first organic material ink and/or the following organic material inks (second organic material ink) through a spin coating process, a dip coating process, a roll coating process, or a printing process.

Furthermore, according to the method of the present invention, the material of the mold can be any mold material generally used in the imprinting process. Preferably, the material of mold is poly(dimethyl siloxane) (PDMS). The free energy of the surface of the mold made from PDMS is extremely low, so the organic material ink can chemically/physically adhere to the substrate, when the organic material ink comes into contact with the substrate. In addition, the surface of the mold is treated with oxygen plasma preferably, before the mold is coated with the organic material ink.

According to the method of the present invention, the substrate may be a silicon substrate, a glass substrate, a quartz substrate, a plastic substrate, or other available substrates. In addition, the anode can be any suitable transparent or opaque conductive layer, such as ITO.

In addition, according to the method of the present invention, the material of the hole transport layer is not particularly limited. Preferably, the material of the hole transport layer comprises: at least one $N^{3+}$ bonding to C, and at least one aromatic tertiary amine containing an aromatic ring.

Preferably, the aromatic tertiary amine is arylamine, such as monarylamine, diarylamine, or triaraylamine. Furthermore, the material of the electron transport layer is not particularly limited. Preferably, the material of the electron transport layer is a metal chelated oxinoid compound, or an oxine chelate, such as Alq$_3$.

The method of the present invention can form a light emitting layer of an OLED with large area in a rapid and inexpensive way, compared to the conventional method such as a vacuum evaporation process. Also, a light-emitting layer can be formed on non-plane surface, and a patterned light-emitting layer can be formed through the method of the present invention, which cannot be easily accomplished by use of the spin coating process.

BRIEF DESCRIPTION OF THE DRAWINGS

FIGS. 2A-2D are process schemes for preparing an OLED in the Embodiment 1 of the present invention;

DETAILED DESCRIPTION OF THE PREFERRED EMBODIMENT

Figure 1:
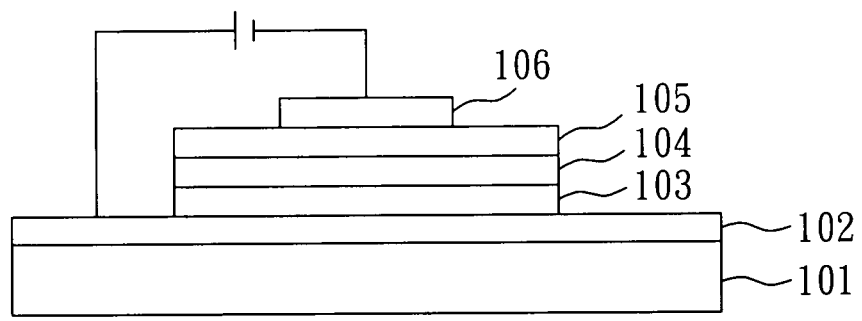
FIG. 1 is a scheme of a conventional OLED.

Hereinbelow, the present invention will be described in detail with reference to the embodiments. The present invention may, however, be embodied in many different forms and should not be construed as being limited to the embodiments set forth herein. Rather, these embodiments are provided to fully convey the concept of the invention to those skilled in the art.

Embodiment 1

First, a substrate 201 was provided, and a first electrode 202 was formed thereon, as shown in FIG. 2A. Herein, the substrate 201 is a glass substrate, and the first electrode 202 is an ITO electrode.

Next, a PEDOT solution was coated on the first electrode 202 through a spin coating process to form a hole transport layer 203, as shown in FIG. 2A. Herein, the PEDOT solution was 7 mg/ml PEDOT in tolunen/isopropanol (volume ratio=4:1). Then, a mold 21 was provided, and coated with first organic material ink 211 through a spin coating process. Herein, the mold 21 was made of PDMS, and the surface of the mold 21 was treated with oxygen plasma before the spin coating process. Furthermore, the first organic material ink 211 used here was a blue organic material, BNE. As shown in FIG. 2B, the first organic material ink 211 coated mold 21 was pressed on the substrate, to transfer the organic material ink 211 onto the first electrode 202 of the substrate 201. Then, a light-emitting layer 204 was obtained, as shown in FIG. 2C.

The substrate 201 with the light-emitting layer 204 formed thereon was placed in an oven at 110° C. for 10 min.

As shown in FIG. 2D, an electron injection/transport layer 205 was coated on light-emitting layer 204, and followed by a second electrode 206. After the aforementioned process, an OLED was obtained in the present embodiment. In the present embodiment, the electron injection transport layer 205 comprised an electron injection layer made of TPBi, and an electron transport layer composed of LiF; and the second electrode 206 was an Al electrode.

Embodiment 2

In the present embodiment, the method for preparing an OLED was similar to that in the Embodiment 1, except that the first organic material ink 211 was an orange organic material with small molecules containing 90 wt % CBP and 10 wt % Ir(pyy)$_3$.

Embodiment 3

In the present embodiment, the method for preparing an OLED was similar to that in the Embodiment 1, except that the first organic material ink 211 was an red organic material with small molecules of Btp2(acac).

Comparative Embodiment 1

In the present comparative embodiment, the method for preparing an OLED was similar to that in the Embodiment 1, except the baking process was not performed.

Comparative Embodiment 2

In the present comparative embodiment, the method for preparing an OLED was similar to that in the Embodiment 2, except the baking process was not performed.

Comparative Embodiment 3

In the present comparative embodiment, the method for preparing an OLED was similar to that in the Embodiment 3, except the baking process was not performed.

Evaluation of the Performance of the OLEDs Prepared in the Embodiment 2 and the Comparative Embodiment 2

Figure 3:
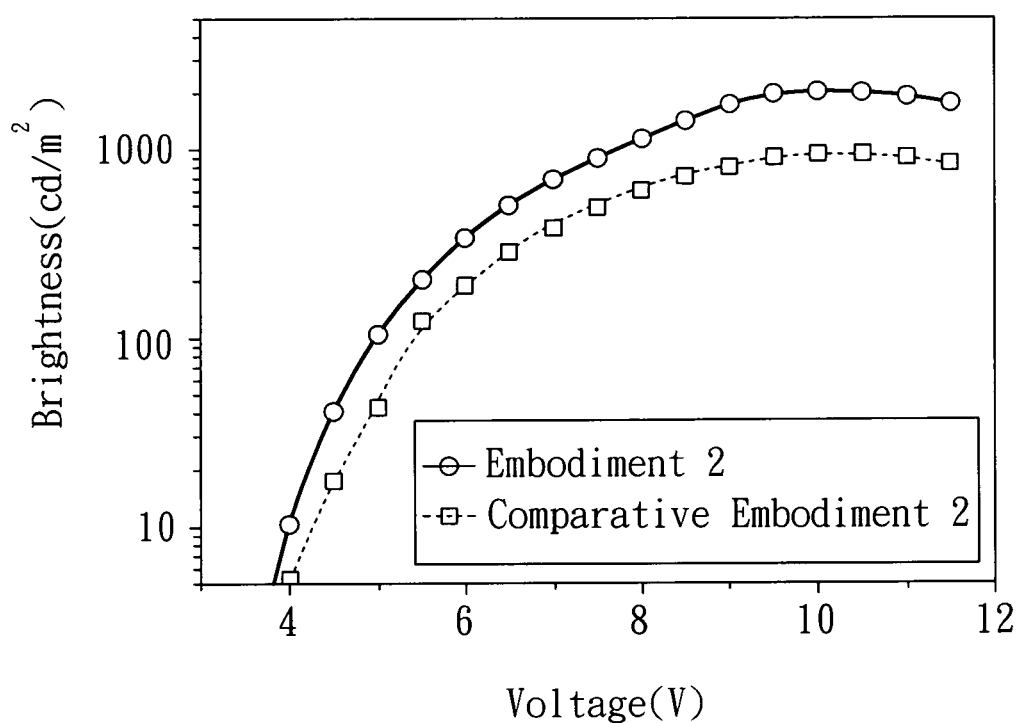
FIG. 3 is the comparisons of resultant brightness of the Embodiment 2 and the Comparative Embodiment 2.

FIG. 3 shows the resultant brightness of OLEDs for the Embodiment 2 and the Comparative Embodiment 2.

As shown in FIG. 3, the maximum brightness of the OLED of the Comparative Embodiment 2, in which the baking process was not performed, was only 900 cd/m$^2$. However, the maximum brightness of the OLED of the Embodiment 2, in which the baking process was performed, was more than 2000 cd/m$^2$. This result indicates that the baking process can greatly improve the performance of the OLED.

Embodiment 4—Preparation of an OLED with Full Color In the present embodiment, the method for preparing an OLED was similar to that in the Embodiment 1, except that the light-emitting layer was prepared by the following process.

Figure 4A:
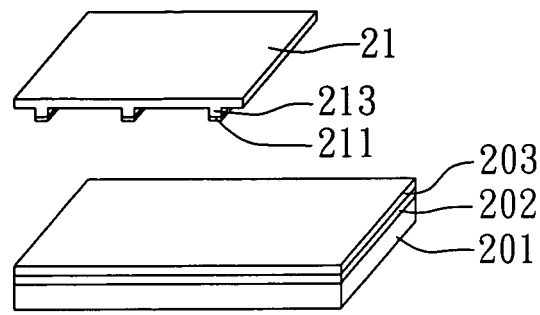
FIGS. 4A-4E are schematic process flow for preparing an OLED in the Embodiment 4 of the present invention.

First, a substrate 201 was provided, which has a first electrode 202 and a hole injection/transport layer 203 formed thereon, as shown in FIG. 4A.

Then, a mold 21 made of PDMS was provided, and a first organic material ink 211 was coated on the mold 21 through a spin coating process. In addition, the surface of the mold 21 has a designed pattern with protrusions 213. Hence, after the coating process, the first organic material ink 211 was absorbed on the protrusions 213 of the mold 21. In this step, the first organic material ink 211 was a blue-emission organic material.

Figure 4B:
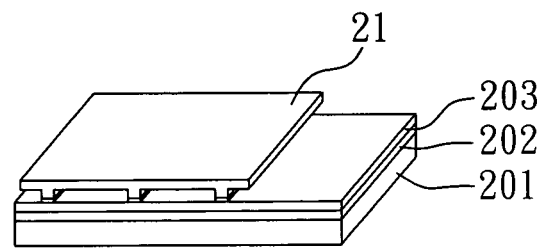

As shown in FIG. 4B, the mold 21 coated with the first organic material ink 211 was pressed on the substrate 201 to transfer the first organic material ink 211 onto the first electrode 202 of the substrate 201 to obtain a first light-emitting array 2041. Herein, the first light-emitting array 2041 was composing of plural first light-emitting pixels, as shown in FIG. 4C.

Figure 4C:
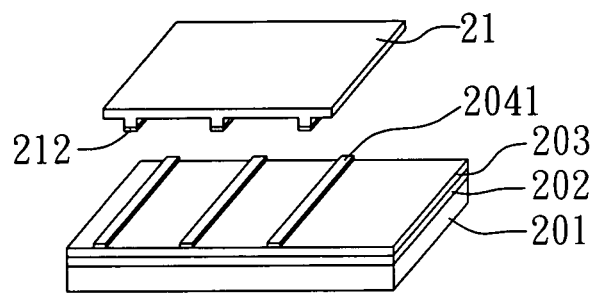
Figure 4D:
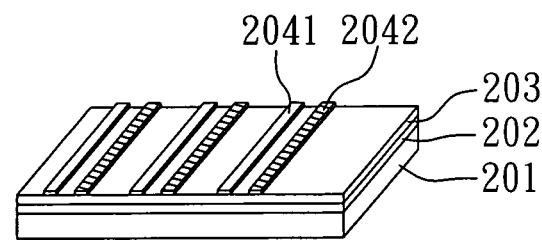

Then, the mold 21 was coated with a second organic material ink 212, as shown in FIG. 4C. Herein, the second organic material ink 212 was a green-emission organic material. Then, the mold 21 coated with the second organic material ink 212 was pressed on the substrate 201 again, to transfer the second organic material ink 212 onto the first electrode 202 of the substrate 201 to obtain a second light-emitting array 2042. Herein, the second light-emitting array 2042 was composing of plural second light-emitting pixels, as shown in FIG. 4D.

Figure 4E:
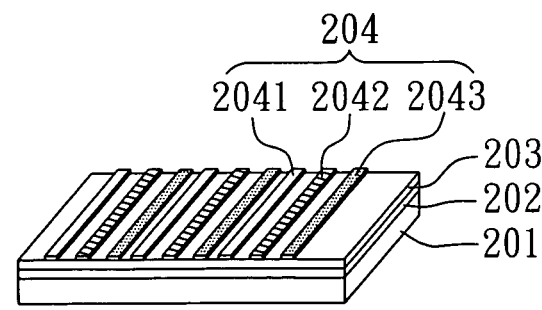

The aforementioned step was repeated, except another second organic material ink was used. In this step, the second organic material ink was a red-emission organic material. After the imprinting process was finished, a third light-emitting array 2043 composing of plural light-emitting pixels was obtained, as shown in FIG. 4E.

The light-emitting layer 204 prepared in the present embodiment comprises: the first light-emitting array 2041 emitting blue light, the second light-emitting array 2042 emitting green light, and the third light-emitting array 2043 emitting red light, wherein the first light-emitting array 2041, the second light-emitting array 2042, and the third light-emitting array 2043 are arranged alternately. Hence, the light-emitting layer 204 can emit light with full-spectrum wavelength.

Finally, the substrate 201 with the light-emitting layer 204 was placed in an oven at 110° C. for 10 min to obtain the light-emitting layer of the OLED of the present embodiment.

In conclusion, an OLED with full-color-spectrum and high color rendering can be obtained through the method for preparing an OLED by an imprinting process of the present invention. In addition, the mold used in the method of the present invention can be reused, so the production cost can be greatly decreased. Furthermore, the light-emitting layer with a large area can be prepared through an imprinting process in the present invention, which cannot be easily accomplished by using the vacuum evaporation process. Additionally, the production cost of the imprinting process is much lower than that of the vacuum evaporation process. Also, the manufacturing rate can be increased greatly through the imprinting process in the present invention.

Although the present invention has been explained in relation to its preferred embodiment, it is to be understood that many other possible modifications and variations can be made without departing from the scope of the invention as hereinafter claimed.

What is claimed is:

1. A method for preparing an OLED by an imprinting process, comprising the following steps:
    (A) providing a substrate, and a first electrode formed thereon, wherein a hole transport layer is formed on the first electrode;
    (B) coating a mold with a first organic material ink after the step (A);
    (C) pressing the mold coated with the first organic material ink onto the substrate, to transfer the first organic material ink on the hole transport layer to form a first light-emitting array after the step (B);
    (D) baking the substrate with the first light-emitting array formed thereon, wherein the substrate with the first light-emitting array formed thereon is baked at 30-200° C. for 10 minutes to 10 hours after the step (C);
    (D') forming an electron transport layer on the first light-emitting array after the step (D); and
    (E) forming a second electrode over the first light-emitting array after the step (D').

2. The method as claimed in claim 1, further comprising steps (C1) and (C2) after the step (C):
    (C1) coating the mold with a second organic material ink; and
    (C2) pressing the mold coated with the second organic material ink onto the substrate to form a second light-emitting array.

3. The method as claimed in claim 2, further comprising a step (C') after the step (C2): repeating the steps (C1) and (C2) to form a plural second light-emitting arrays.

4. The method as claimed in claim 2, wherein the step (E) forms a second electrode over the first light-emitting array and the second light-emitting array.

5. The method as claimed in claim 3, wherein the step (E) forms a second electrode over the first light-emitting array and the plural second light-emitting arrays.

6. The method as claimed in claim 1, wherein the mold has a pattern with plural protrusion structures.

7. The method as claimed in claim 1, wherein the first light-emitting array has plural first light-emitting pixels.

8. The method as claimed in claim 2, wherein second light-emitting array have plural second light-emitting pixels.

9. The method as claimed in claim 2, wherein the first light-emitting pixels and the following light-emitting pixels are arranged alternately.

10. The method as claimed in claim 2, further comprising a step (D') after the step (D): forming an electron transport layer on the first light-emitting array and the second light-emitting array.

11. The method as claimed in claim 3, further comprising a step (D') after the step (D): forming an electron transport layer on the first light-emitting array and the plural second light-emitting arrays.

12. The method as claimed in claim 1, wherein the mold is coated with the first organic material ink through a spin coating process, a dip coating process, a roll coating process, or a printing process in the step (B).

13. The method as claimed in claim 2, wherein the mold is coated with the second organic material ink through a spin coating process, a dip coating process, a roll coating process, or a printing process in the step (C1).

14. The method as claimed in claim 1, wherein the mold is made of PDMS.

15. The method as claimed in claim 1, wherein the surface of the mold is treated with oxygen plasma.

16. The method as claimed in claim 1, wherein the substrate is a silicon substrate, a glass substrate, a quartz substrate, or a plastic substrate.

17. The method as claimed in claim 1, wherein the OLED has a brightness of more than 2000 $cd/m^2$.

18. The method as claimed in claim 1, wherein the baking in step D was for ten minutes at 110 degrees centigrade.

19. The method as claimed in claim 1, wherein the baking in step D was for a sufficient time and temperature to produce an OLED with a brightness of more than 2000 $cd/m^2$.

* * * * *